US012811362B2

(12) United States Patent
Itabashi et al.

(10) Patent No.: US 12,811,362 B2
(45) Date of Patent: Nov. 24, 2026

(54) FLIP-CHIP MOUNTED, INTEGRATED LASER AND MODULATOR UNIT WITH IMPROVED HEAT DISSIPATION

(71) Applicant: Sumitomo Electric Industries, Ltd., Osaka (JP)

(72) Inventors: Naoki Itabashi, Osaka (JP); Hiroshi Hara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1114 days.

(21) Appl. No.: 17/475,571

(22) Filed: Sep. 15, 2021

(65) Prior Publication Data

US 2022/0085568 A1 Mar. 17, 2022

(30) Foreign Application Priority Data

Sep. 16, 2020 (JP) ................................ 2020-155500

(51) Int. Cl.

| | |
|---|---|
| ***H01S 5/02315*** | (2021.01) |
| ***H01S 5/02325*** | (2021.01) |
| ***H01S 5/0234*** | (2021.01) |
| ***H01S 5/02345*** | (2021.01) |
| ***H01S 5/024*** | (2006.01) |
| ***H01S 5/026*** | (2006.01) |

(52) U.S. Cl.

CPC ...... *H01S 5/02315* (2021.01); *H01S 5/02345* (2021.01); *H01S 5/02469* (2013.01); *H01S 5/02476* (2013.01); *H01S 5/02325* (2021.01); *H01S 5/0234* (2021.01); *H01S 5/0265* (2013.01)

(58) Field of Classification Search

CPC ............. H01S 5/02315; H01S 5/02345; H01S 5/02469; H01S 5/02476; H01S 5/02325; H01S 5/0234; H01S 5/0265

See application file for complete search history.

(56) References Cited

U.S. PATENT DOCUMENTS

| | | | | |
|---|---|---|---|---|
| 6,236,771 | B1 * | 5/2001 | Aoki | H01S 5/02375 385/2 |
| 6,437,899 | B1 | 8/2002 | Noda | |
| 2007/0248363 | A1 * | 10/2007 | Kagaya | H01S 5/02325 385/2 |
| 2010/0254665 | A1 * | 10/2010 | Kubota | G02B 6/4204 385/88 |

(Continued)

FOREIGN PATENT DOCUMENTS

| | | |
|---|---|---|
| JP | 2001-209017 A | 8/2001 |
| WO | 2016/152152 A1 | 9/2016 |

*Primary Examiner* — M. A. Golub-Miller

(74) *Attorney, Agent, or Firm* — McCarter & English, LLP; Michael A. Sartori

(57) ABSTRACT

A light semiconductor device according to an embodiment includes: a carrier having a first pattern for transmitting a signal and a second pattern having a reference potential constituting a coplanar line together with the first pattern on a front surface; a modulator having a first electrode provided on a back surface and connected to the second pattern of the carrier and a second electrode provided on a front surface and connected to the first pattern of the carrier; and a first connection portion having one end connected to the second pattern of the carrier and the other end connected to the first electrode of the modulator. The front surface of the modulator and a front surface of the carrier face each other.

10 Claims, 8 Drawing Sheets

(56) References Cited

U.S. PATENT DOCUMENTS

| | | | | |
|---|---|---|---|---|
| 2010/0260226 | A1* | 10/2010 | Tamaya | H01S 5/02315 372/50.12 |
| 2012/0045161 | A1* | 2/2012 | Okada | H01S 5/02345 385/1 |
| 2012/0250711 | A1* | 10/2012 | Makino | H01S 5/02255 359/245 |
| 2018/0067341 | A1 | 3/2018 | Kanazawa et al. | |
| 2020/0176948 | A1* | 6/2020 | Wojcik | H01S 5/02234 |
| 2021/0336701 | A1* | 10/2021 | Noguchi | H01S 5/02212 |
| 2022/0103262 | A1* | 3/2022 | Noguchi | H01S 5/0239 |
| 2022/0231477 | A1* | 7/2022 | Lam | H01S 5/023 |
| 2023/0042492 | A1* | 2/2023 | Maeda | H01S 5/0234 |
| 2023/0139615 | A1* | 5/2023 | Kanazawa | G02F 1/0121 |
| 2023/0198221 | A1* | 6/2023 | Yamanaka | H01S 5/023 372/43.01 |
| 2024/0072512 | A1* | 2/2024 | Nasu | H01S 5/02345 |
| 2024/0213740 | A1* | 6/2024 | Wang | H01S 5/022 |

* cited by examiner

FLIP-CHIP MOUNTED, INTEGRATED LASER AND MODULATOR UNIT WITH IMPROVED HEAT DISSIPATION

CROSS-REFERENCE TO RELATED APPLICATIONS

This application claims the benefit of priority from Japanese Patent Application No. 2020-155500, filed on Sep. 16, 2020, the entire contents of which are incorporated herein by reference.

TECHNICAL FIELD

The present disclosure relates to a light semiconductor device.

BACKGROUND

Japanese Unexamined Patent Publication No. 2001-209017 discloses a photoelectric conversion semiconductor device. The photoelectric conversion semiconductor device includes a semiconductor laser element attached with a light modulator including a semiconductor laser unit and a light modulator unit, a high-frequency electric circuit including a high-frequency circuit board and a transmission line, a terminating resistor, a capacitive matching circuit, and a plurality of metal wires.

In addition, Japanese Unexamined Patent Publication No. 2001-209017 discloses a flip-chip type semiconductor laser device attached with a light modulator. This semiconductor laser device includes a flip-chip type semiconductor laser element attached with a light modulator including a semiconductor laser unit and a light modulator unit, an open-type stub, a terminating resistor, a through hole, and electrodes. The electrodes include a signal input electrode to the light modulator unit, a ground electrode of the semiconductor laser element, and a laser input electrode that inputting a drive current to the semiconductor laser unit.

The semiconductor laser element attached with the light modulator is connected to a transmission line of a high-frequency electric circuit via the signal input electrode and solder. In addition, the semiconductor laser element attached with the light modulator is connected to the through hole via the ground electrode, the solder, and the transmission line of the high-frequency electric circuit. The through hole connects one end of the resistor via the transmission line.

SUMMARY

According to one aspect, there is provided a light semiconductor device including: a board; a carrier having a first pattern mounted on the board and transmitting a signal, a second pattern having a reference potential constituting a coplanar circuit together with the first pattern, and a third pattern for supplying a direct current on a front surface; a modulator mounted on the carrier and having a first electrode provided on a back surface and connected to the second pattern of the carrier and a second electrode provided on a front surface and connected to the first pattern of the carrier; a laser unit mounted on the carrier and having a third electrode provided on a back surface and connected to the second pattern of the carrier and a fourth electrode provided on a front surface and connected to the third pattern of the carrier; a first connection portion having one end connected to the second pattern of the carrier and the other end connected to the first electrode; and a second connection portion having one end connected to the front surface of the board and the other end connected to the third electrode of the laser unit. The modulator and the laser unit are mounted so that the respective front surfaces and the front surface of the carrier face each other.

According to another aspect, there is provided a light semiconductor device including: a carrier having a first pattern for transmitting a signal and a second pattern having a reference potential constituting a coplanar line together with the first pattern on a front surface; a modulator having a first electrode provided on a back surface and connected to the second pattern of the carrier and a second electrode provided on a front surface and connected to the first pattern of the carrier; and a first connection portion having one end connected to the second pattern of the carrier and the other end connected to the first electrode of the modulator. The front surface of the modulator and the front surface of the carrier face each other.

DETAILED DESCRIPTION

Description of Embodiments of Present Disclosure

Figure 1:
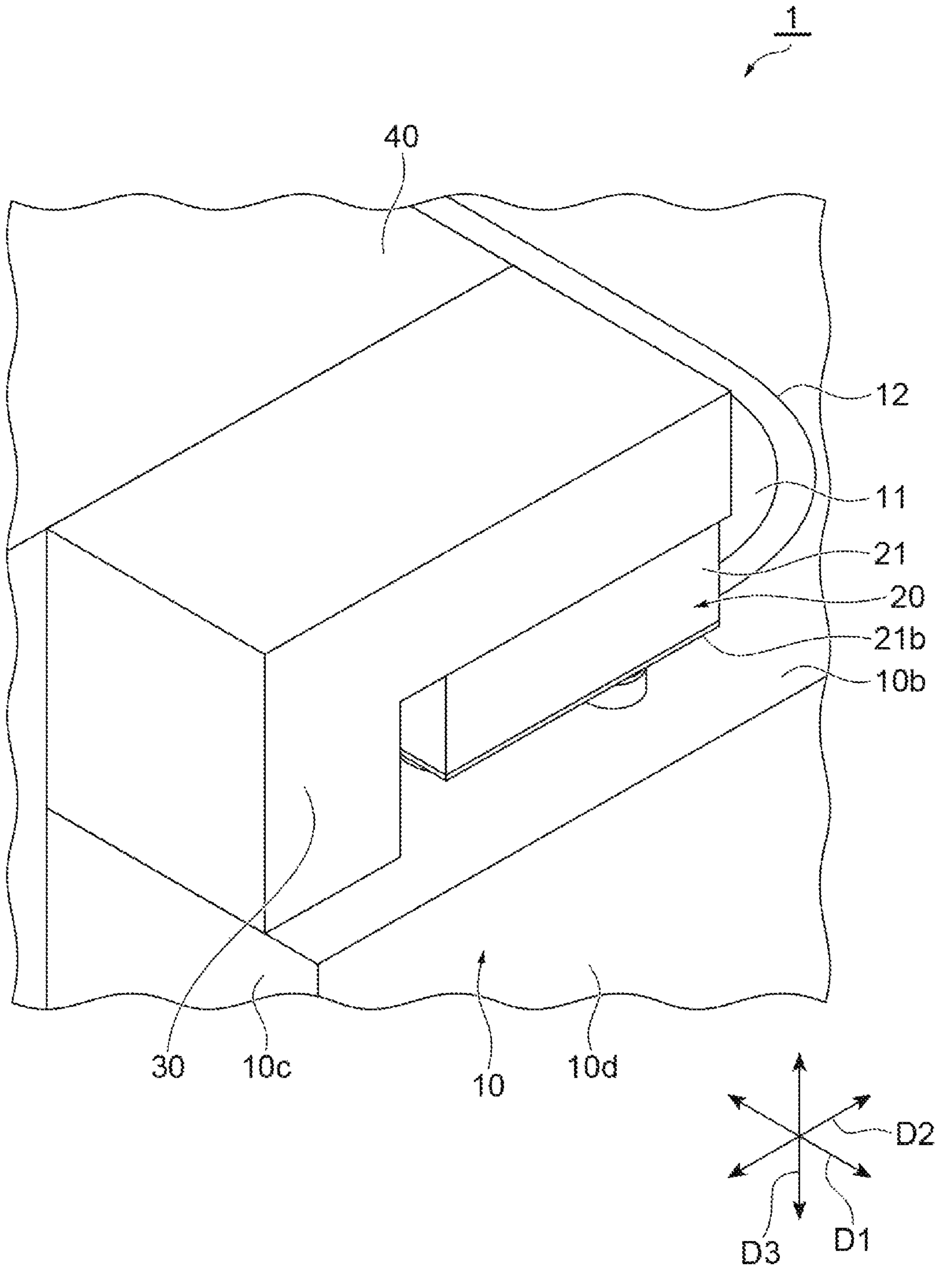
FIG. 1 is a perspective view illustrating a carrier, a modulator, and a first connection portion in the light semiconductor device according to an embodiment.

First, contents of embodiments of the present disclosure will be listed and described. A light semiconductor device according to one embodiment includes: a board; a carrier having a first pattern mounted on the board and transmitting a signal, a second pattern having a reference potential constituting a coplanar circuit together with the first pattern, and a third pattern for supplying a direct current on a front surface; a modulator mounted on the carrier and having a first electrode provided on a back surface and connected to the second pattern of the carrier and a second electrode provided on a front surface and connected to the first pattern of the carrier; a laser unit mounted on the carrier and having a third electrode provided on a back surface and connected to the second pattern of the carrier and a fourth electrode provided on a front surface and connected to the third pattern of the carrier; a first connection portion having one end connected to the second pattern of the carrier and the other end connected to the first electrode; and a second connection portion having one end connected to the front surface of the board and the other end connected to the third electrode of the laser unit. The modulator and the laser unit are mounted so that the respective front surfaces and the front surface of the carrier face each other.

The light semiconductor device includes the board, the carrier, and the integrated semiconductor laser, and the integrated semiconductor laser includes the modulator and the laser unit. The integrated semiconductor laser is mounted on the carrier so that each of the front surfaces of the modulator and the laser unit faces the front surface of the carrier. The carrier has a first pattern, a second pattern, and a third pattern on the front surface of the carrier, and the modulator has a second electrode on the front surface of the modulator. The laser unit has a fourth electrode on the front surface of the laser unit. The fourth electrode is connected to the third pattern of the carrier, and the second electrode is connected to the first pattern of the carrier. The light semiconductor device includes the first connection portion and the second connection portion. The first connection portion connects the first electrode formed on the back surface of the modulator and the second pattern formed on the front surface of the carrier. Therefore, when the cathode electrode is formed as the first electrode on the back surface of the modulator, a return path of a high-frequency signal fed from the line can be secured, and inductance that reaches a ground side can be reduced. Furthermore, the second connection portion connects the third electrode formed on the back surface of the laser unit and the front surface of the board. Therefore, the laser unit is connected to the front surface of the board via the second connection portion, and a heat dissipation path from the laser unit to the board can be secured, so that the heat dissipation can be improved.

The modulator and the laser unit may be an integrated semiconductor laser attached with a modulator, or the modulator and the laser unit may be separate bodies. Even if the modulator and the laser unit of the present disclosure are separate bodies, it is possible to obtain the effects such as securing the return path and securing the heat dissipation path by the first connection portion and the second connection portion of the light semiconductor device. It should be noted that, in the semiconductor laser attached with a modulator in which the modulator and the laser unit are integrated, since the return path, the heat dissipation path, and the like are easily affected by the integration, the effect of providing the first connection portion and the second connection portion of the light semiconductor device can be further improved.

One end of the first connection portion may have a first surface, and the other end of the first connection portion may have a second surface. One end of the second connection portion may have a third surface, and the other end of the second connection portion may have a fourth surface. In this case, the one end of the first connection portion can be in surface-contact with the second pattern, and the other end of the first connection portion can be in surface-contact with the first electrode of the modulator. Then, the one end of the second connection portion can be in surface-contact with the front surface of the board, and the other end of the second connection portion can be in surface-contact with the third electrode of the laser unit. Therefore, the effect of the return path of the high-frequency signal and the effect of securing the heat dissipation path can be further improved.

The second connection portion may further have a fifth surface intersecting the third surface of the second connection portion, the third surface of the second connection portion may be connected to the front surface of the board, and the fifth surface of the second connection portion may be arranged along the side surface of the carrier. In this case, the fifth surface, which is one side surface of the second connection portion, can be arranged along the carrier.

The board may be made of a metal or an insulator. In this case, a metal board or an insulator board can be used.

The carrier may be made of an insulator.

The first connection portion may be made of a metal or an insulator. In this case, it is possible to use the first connection portion made of a metal or the first connection portion made of an insulator.

The second connection portion may be made of a metal or an insulator. In this case, it is possible to use a second connection portion made of a metal or a second connection portion made of an insulator.

At least one of the first connection portion and the second connection portion may be made of an insulator, and a metal pattern may be formed on the front surface of the insulator. In this case, it is possible to form a metal pattern on the contact surface with the integrated semiconductor laser in at least one of the first connection portion and the second connection portion.

The first connection portion and the second connection portion may be integrated. In this case, the first connection portion and the second connection portion are configured as one component. Therefore, it is possible to suppress an increase in the number of components and easily handle the first connection portion and the second connection portion.

A light semiconductor device according to another embodiment includes: a carrier having a first pattern for transmitting a signal and a second pattern having a reference potential constituting a coplanar line together with the first pattern on a front surface; a modulator having a first electrode provided on a back surface and connected to the second pattern of the carrier and a second electrode provided on a front surface and connected to the first pattern of the carrier; and a first connection portion having one end connected to the second pattern of the carrier and the other end connected to the first electrode of the modulator. The front surface of the modulator and the front surface of the carrier face each other.

This light semiconductor device includes the carrier and the modulator. The modulator is mounted on the carrier so that the front surface of the modulator faces the front surface of the carrier. The carrier has the first pattern and the second pattern on the front surface of the carrier, and the second electrode is formed on the front surface of the modulator. The second electrode is connected to the first pattern of carriers. The light semiconductor device includes a first connection portion, and the first connection portion connects the first electrode formed on the back surface of the modulator and the second pattern formed on the front surface of the carrier. Therefore, when the cathode electrode is formed as the first electrode on the back surface of the modulator, the return path of the high-frequency signal fed from the line can be secured. Therefore, the inductance that reaches the ground side can be reduced.

The thermal conductivity of the board may be higher than the thermal conductivity of the carrier.

Detailed Description of Embodiments of Present Disclosure

Specific examples of the light semiconductor device of the embodiment will be described below with reference to the drawings. It should be noted that the present invention is not limited to the following examples, but is illustrated in the claims and is intended to include all modifications within the scope equivalent to the claims. In the description of the drawings, the same or corresponding elements are denoted by the same reference numerals, and duplicate description will be omitted as appropriate. The drawings may be partially simplified or exaggerated in order to facilitate understanding, and the dimensional ratio and the like are not limited to those described in the drawings.

Figure 2:
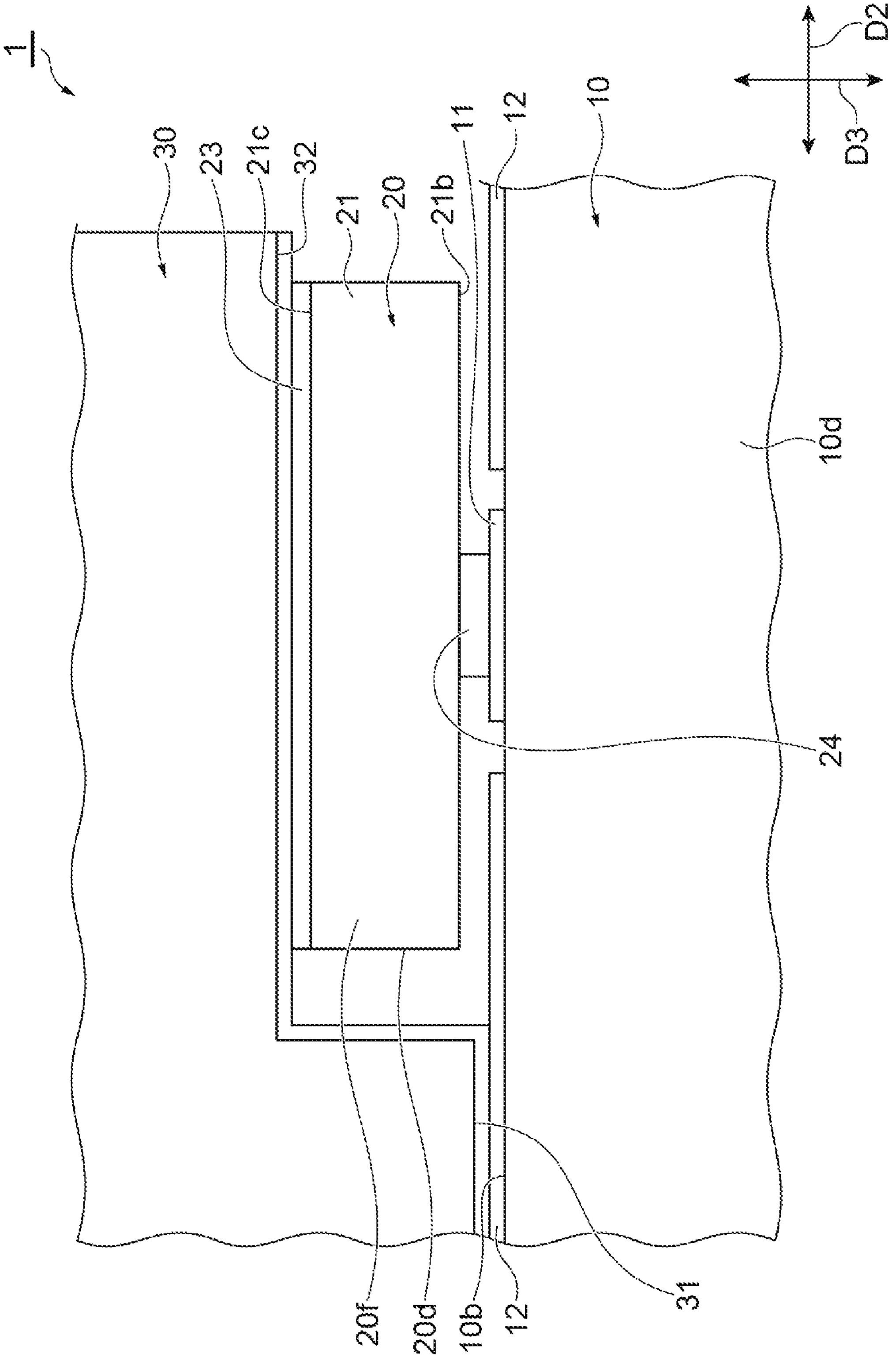
FIG. 2 is a cross-sectional view schematically illustrating the carrier, the modulator, and the first connection portion of FIG. 1.
Figure 3:
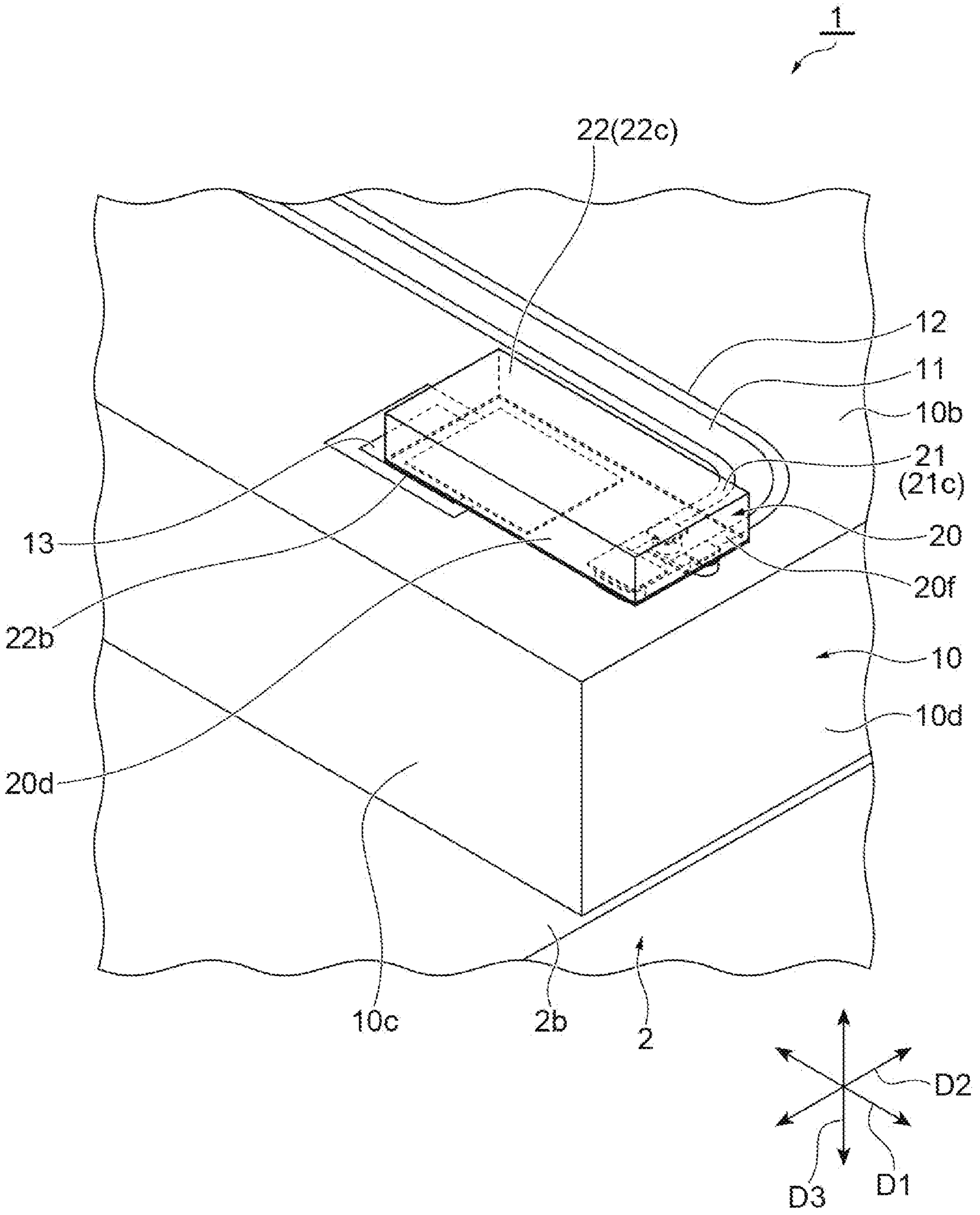
FIG. 3 is a perspective view illustrating a board, the carrier, and an integrated semiconductor laser device of the light semiconductor device of FIG. 1.

FIG. 1 is a perspective view illustrating a carrier 10, an integrated semiconductor laser 20, and a first connection portion 30 of a light semiconductor device 1 according to an embodiment. FIG. 2 is a schematic side view of the carrier 10, the integrated semiconductor laser 20, and the first connection portion 30. FIG. 3 is a perspective view illustrating a board 2, the carrier 10, and the integrated semiconductor laser 20 of the light semiconductor device 1.

The integrated semiconductor laser 20 is, for example, an electric field absorption type modulator integrated laser (EML: Electro-absorption Modulator Laser Diode) including an electric field absorption modulator (electro-absorption (EA) modulator). As an example, the integrated semiconductor laser 20 has a plate shape having a thickness in a third direction D3.

As illustrated in FIGS. 1, 2, and 3, in the light semiconductor device 1, the board 2, the carrier 10, and the integrated semiconductor laser 20 are stacked in this order. The board 2 is made of, for example, copper tungsten (CuW). The board 2 functions as a base for the carrier 10 and the integrated semiconductor laser 20. It should be noted that the material of the board 2 may be other than copper tungsten and may be any one of copper molybdenum (CuMo), aluminum nitride (AlN), aluminum silicon carbide (Al—SiC), and magnesium silicon carbide (Mg—SiC).

For example, the carrier 10 is made of an insulator. The material of the carrier 10 may be aluminum nitride (AlN) as an example. Since AlN is a heat-dissipating material having high heat-dissipation, AlN is suitable for heat-dissipating through the carrier 10. However, since the dielectric constant of AlN is high, the carrier 10 made of AlN is not suitable for high-frequency transmission. The carrier 10 may be made of an aluminum oxide (AlO) having lower heat dissipation than AlN.

The board 2 has a front surface 2*b* on which the carrier 10 is mounted, and the carrier 10 has a front surface 10*b* on which the integrated semiconductor laser 20 is mounted. For example, the front surface 10*b* extends in a first direction D1 which is a longitudinal direction of the integrated semiconductor laser 20 and a second direction D2 which is a width direction of the integrated semiconductor laser 20, and has a thickness in the third direction D3. The carrier 10 has, for example, a side surface 10*c* extending in the first direction D1 and the third direction D3 and a side surface 10*d* extending in the second direction D2 and the third direction D3.

The carrier 10 has a first pattern 11 for transmitting a signal, a second pattern 12 having a reference potential together with the first pattern 11 constituting a coplanar circuit, and a third pattern 13 for supplying a direct current on the front surface 10*b*. The integrated semiconductor laser 20 is a semiconductor laser attached with a modulator including a modulator 21 and a laser unit 22. The modulator 21 has a front surface 21*b* facing the carrier 10 and a back surface 21*c* facing the opposite side of the carrier 10. The modulator 21 and the laser unit 22 may be the integrated semiconductor laser 20 attached with a modulator, or the modulator 21 and the laser unit 22 may be separate bodies.

Similarly to the modulator 21, the laser unit 22 also has a front surface 22*b* facing the carrier 10 and a back surface 22*c* facing the opposite side of the carrier 10. The integrated semiconductor laser 20 further has a side surface 20*d* extending in the first direction D1 and the third direction D3 and a side surface 20*f* extending in the second direction D2 and the third direction D3. Each of the first connection portion 30 and a second connection portion 40 faces the side surface 20*d*.

The light semiconductor device 1 further has the first connection portion 30 connected to the front surface 10*b* of the carrier 10 and the back surface 21*c* of the modulator 21 and the second connection portion 40 connected to the front surface 2*b* of the board 2 and the back surface 22*c* of the laser unit 22. One end of the first connection portion 30 is connected to the second pattern 12 of the carrier 10, and the other end of the first connection portion 30 is connected to a first electrode 23 of the first conductivity type of the modulator 21.

For example, the second pattern 12 is a GND pattern, and the first electrode 23 is a cathode electrode of the modulator 21. The first pattern 11 is provided on the front surface 10*b* of the carrier 10 and is connected to a second electrode 24 of the modulator 21. For example, the first pattern 11 is a pattern electrode for transmitting a signal, and the second electrode 24 is an anode electrode of the modulator 21.

Figure 4:
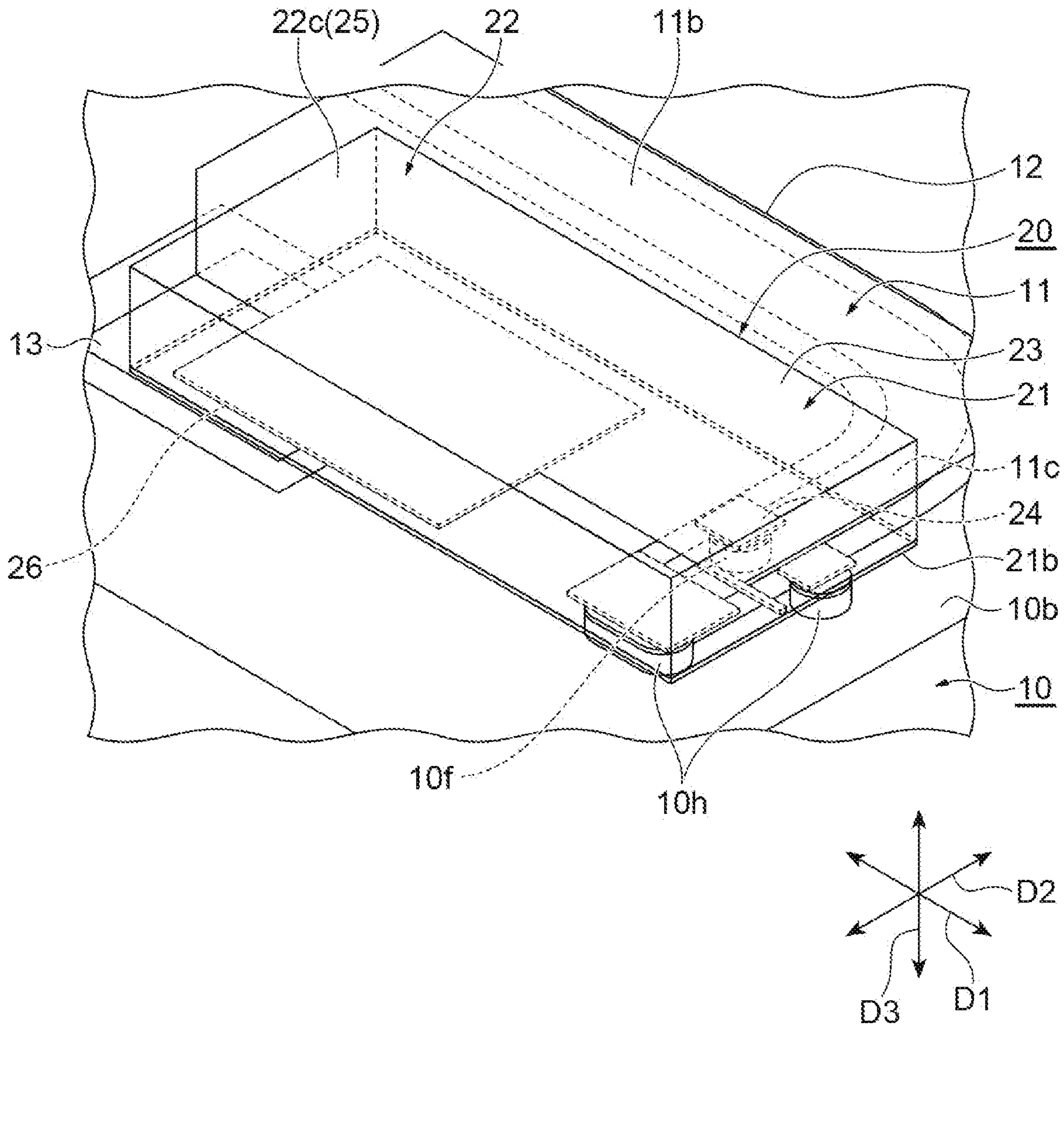
FIG. 4 is a perspective view illustrating the modulator and a laser unit of the integrated semiconductor laser device of FIG. 3.

FIG. 4 is an enlarged perspective view of the integrated semiconductor laser 20 of FIG. 3. As illustrated in FIG. 4, the first pattern 11 connected to the anode electrode of the modulator 21 transmits a high-frequency signal. For example, an absorption current flows through the second electrode 24 which is the anode electrode. For example, the first pattern 11 extends from the facing position of the carrier 10 and the integrated semiconductor laser 20 to one side of the second direction D2 and is curved along the first direction D1.

A pillar 10*f* protruding from the front surface 10*b* is interposed between the front surface 10*b* of the carrier 10 and the front surface 21*b* of the modulator 21. The pillar 10*f* electrically connects the first pattern 11 of the carrier 10 and the anode electrode of the modulator 21. The carrier 10 has, for example, a plurality of pillars 10*g* (not illustrated). The plurality of pillars 10*g* electrically connect the anode electrode of the laser unit 22 and the pattern of the carrier 10. The integrated semiconductor laser 20 is mounted in a flip-chip manner on the carrier 10, and a plurality of pillars 10*h* are provided for stable flip-chip mounting.

The first pattern 11 has a first extension portion 11*b* extending in the first direction D1 and a second extension portion 11*c* curved from the first extension portion 11*b* and directed toward the integrated semiconductor laser 20. The first pattern 11 is made of, for example, gold (Au). The second pattern 12 is, for example, a line GND provided on the front surface 10*b* of the carrier 10.

The laser unit 22 of the integrated semiconductor laser 20 is, for example, a heating body. The laser unit 22 has a third electrode 25 of the first conductivity type provided on the back surface 22*c* and a fourth electrode 26 of the second conductivity type provided on the front surface 22*b* and connected to the third pattern 13 of the carrier 10. The third pattern 13 supplies a direct current (LD current) to the laser unit 22. The third electrode 25 together with, for example, the first electrode 23 described above constitutes a common cathode on the back surface of the integrated semiconductor laser 20.

Figure 5:
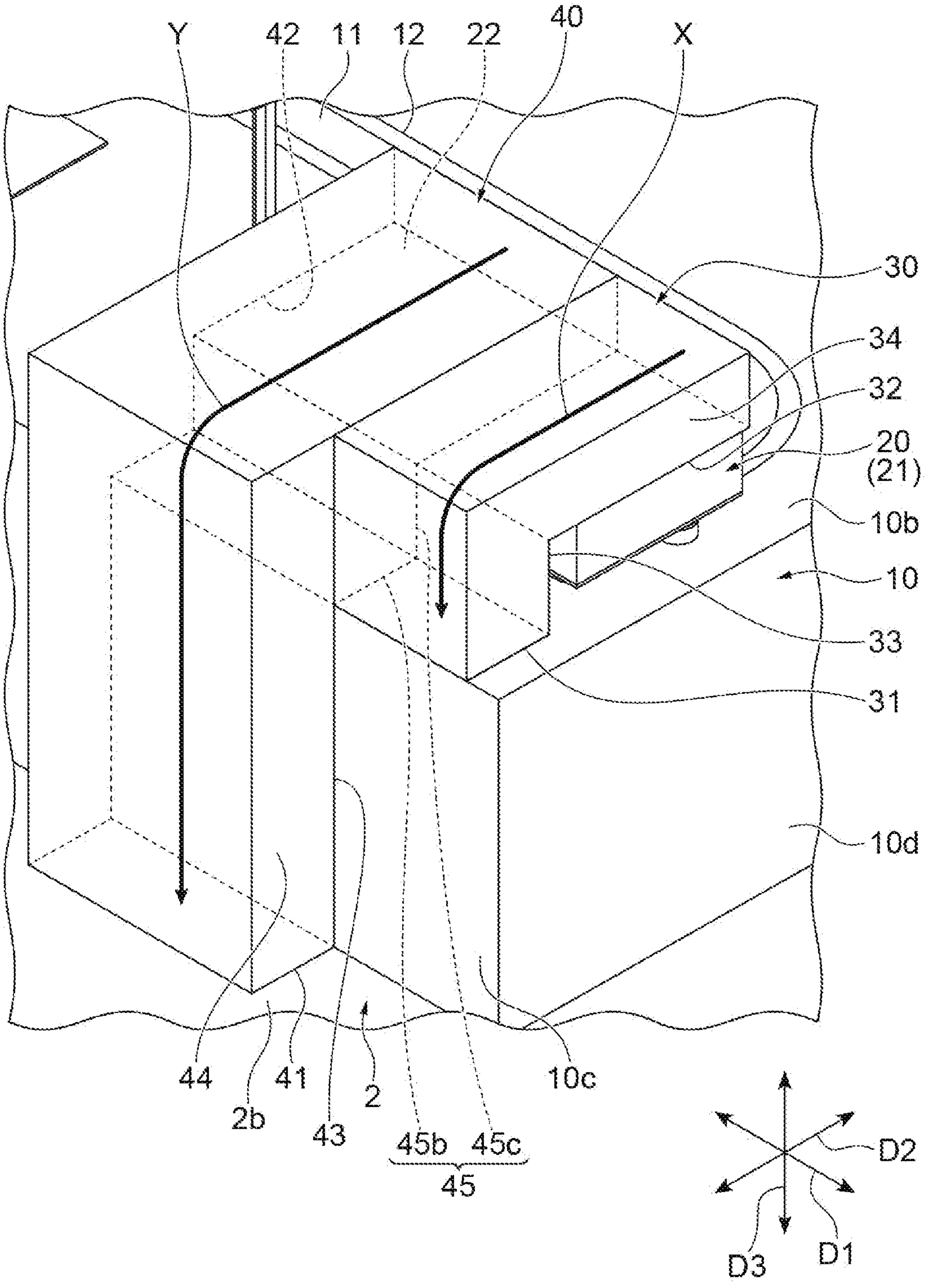
FIG. 5 is a perspective view illustrating the board, the carrier, the integrated semiconductor laser device, the first connection portion, and a second connection portion in the light semiconductor device of FIG. 1.

FIG. 5 is a perspective view illustrating the first connection portion 30 that connects the carrier 10 and the integrated semiconductor laser 20 to each other and the second connection portion 40 that connects the board 2 and the integrated semiconductor laser 20 to each other. As illustrated in FIG. 5, the shape of the first connection portion 30 viewed along the first direction D1 has an L shape, and the integrated semiconductor laser 20 (modulator 21) is arranged inside the L shape. Similarly to the first connection portion 30, the second connection portion 40 has an L shape, and the integrated semiconductor laser 20 (laser unit 22) is arranged inside the L shape.

As illustrated in FIGS. 2 and 5, the first connection portion 30 has a first surface 31 at one end connected to the second pattern 12 of the carrier 10 and has a second surface 32 at the other end connected to the first electrode 23 of the modulator 21. That is, the first connection portion 30 is connected to the line GND (second pattern 12) from the cathode electrode (first electrode 23) of the modulator 21 via the first connection portion 30 (second surface 32 and first surface 31).

The first connection portion 30 forms a high-frequency return path X. The inductance of the first connection portion 30 is smaller than the inductance of the second connection portion 40. The second connection portion 40 is connected to the board 2 (front surface 2*b*) from the cathode electrode (third electrode 25) of the laser unit 22 via the second connection portion 40 (fourth surface 42 and third surface 41). The second connection portion 40 forms a heat dissipation path Y extending from the laser unit 22 to the board 2. For example, the thermal resistance of the second connection portion 40 is smaller than the thermal resistance of the first connection portion 30.

Figure 6:
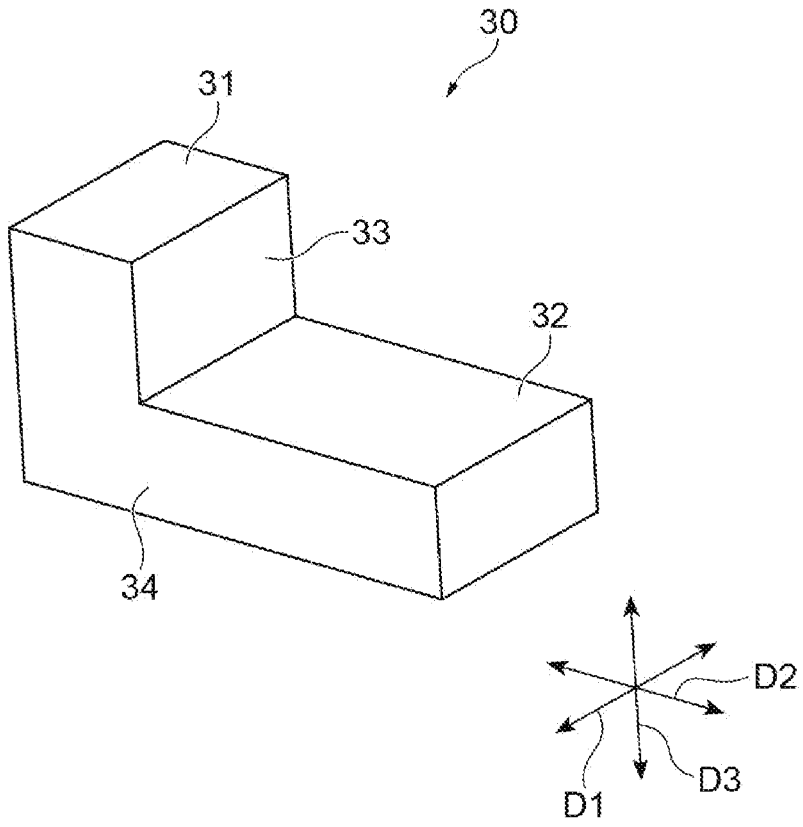
FIG. 6 is a perspective view illustrating the first connection portion of FIG. 5.

FIG. 6 is a perspective view illustrating the first connection portion 30. As illustrated in FIGS. 5 and 6, the first connection portion 30 has the first surface 31 connected to the carrier 10, the second surface 32 connected to the modulator 21, an inner surface 33 extending between the first surface 31 and the second surface 32, and a pair of outer surfaces 34 having an L shape and being aligned along the first direction D1.

For example, each of the first surface 31, the second surface 32, the inner surface 33, and the outer surface 34 has a flat shape. The first surface 31, the second surface 32, and the inner surface 33 have, for example, a rectangular shape. The inner surface 33 of the first connection portion 30 is separated from, for example, the modulator 21. For example, the area of the second surface 32 is larger than the area of the first surface 31. As a result, since a wide contact area with the back surface 21*c* of the modulator 21 can be secured, the inductance attached to the GND side (hereinafter, also referred to as $L_{gnd}$) can be reduced.

Figure 7:
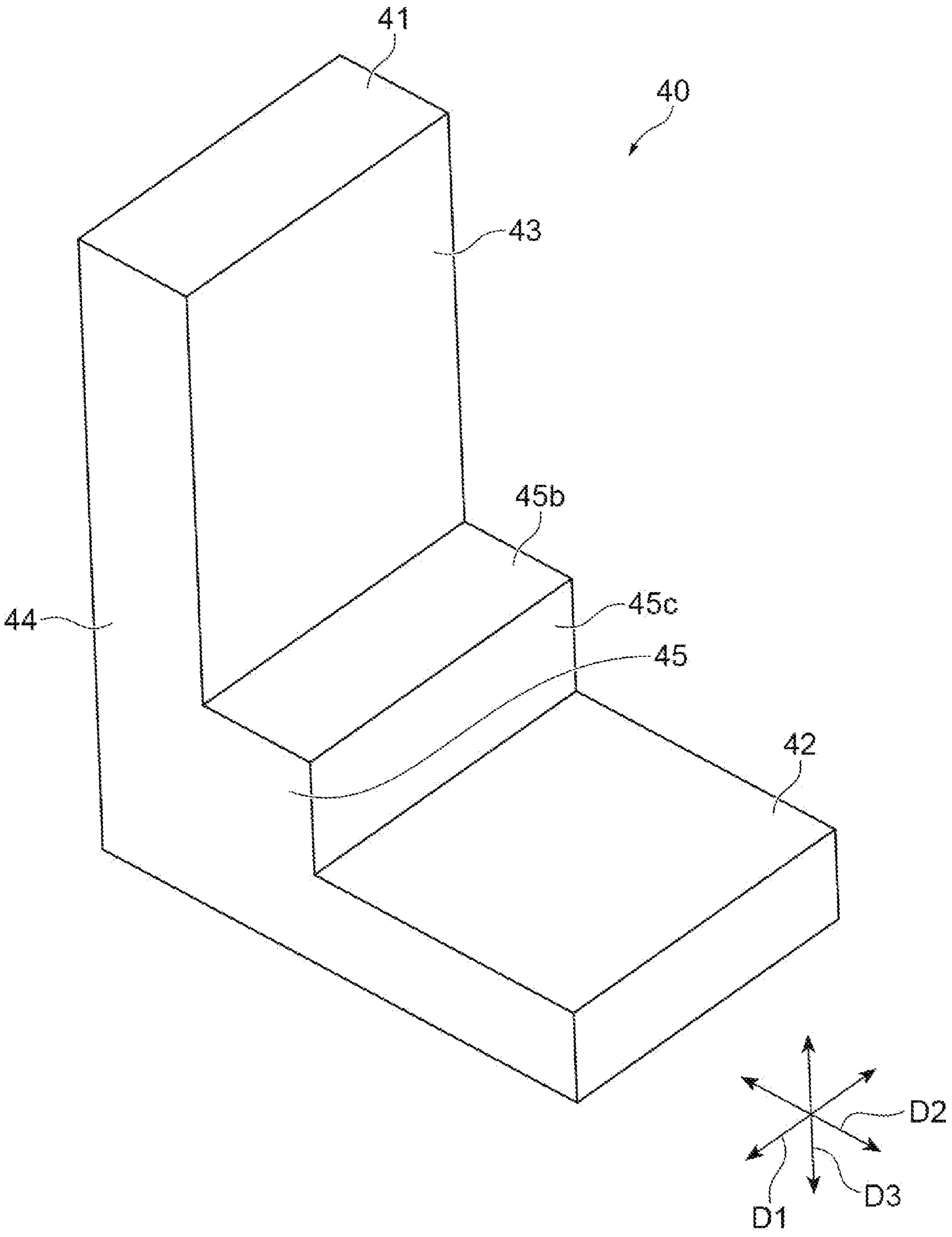
FIG. 7 is a perspective view illustrating the second connection portion of FIG. 5.

FIG. 7 is a perspective view illustrating the second connection portion 40. As illustrated in FIGS. 5 and 7, the second connection portion 40 has a third surface 41 connected to the front surface 2*b* of the board 2, a fourth surface 42 connected to the laser unit 22, and a fifth surface 43 extending from one end of the third surface 41 in the second direction D2 to the third direction D3 and the first direction D1. For example, the third surface 41 is a base connection point connected to the base board 2. The fourth surface 42 is, for example, a connection point with the laser unit 22 (back surface 22*c*) of the integrated semiconductor laser 20.

Furthermore, the second connection portion 40 has a pair of outer surfaces 44 having an L shape and being aligned along the first direction D1, and a convex portion 45 protruding inward of the L shape. The convex portion 45 has a carrier facing surface 45*b* extending in the first direction D1 and the second direction D2 and a laser facing surface 45*c* extending in the first direction D1 and the third direction D3. The carrier facing surface 45*b* is, for example, a portion connected to the second pattern 12 of the carrier 10.

Each of the third surface 41, the fourth surface 42, the fifth surface 43, the outer surface 44, the carrier facing surface 45*b*, and the laser facing surface 45*c* has, for example, a flat shape. The third surface 41, the fourth surface 42, the fifth surface 43, the carrier facing surface 45*b*, and the laser facing surface 45*c* have, for example, a rectangular shape. The fifth surface 43 of the second connection portion 40 extends along, for example, the side surface 10*c* of the carrier 10. For example, the area of the fourth surface 42 is larger than the area of the third surface 41. The fifth surface 43 constitutes, for example, a wall portion that is abutted against the carrier 10.

As a result, a wide contact area of the laser unit 22 with the back surface 22*c* can be secured, so that the heat dissipation from the laser unit 22 can be improved. The second connection portion 40 may have fins in order to improve the heat dissipation. The second connection portion 40 dissipates the heat of the laser unit 22 to the board 2 along the heat dissipation path Y extending from the laser unit 22 to the board 2 beyond the carrier 10.

Therefore, it is possible to reduce the need to consider the heat dissipation of the carrier 10, and thus, it is possible to increase the degree of freedom of the material of the carrier 10. As a result, it is possible to design the carrier 10 suitable for high frequency without considering the heat dissipation, so that good high-frequency characteristics can be realized by the carrier 10.

At least one of the fifth surface 43 and the carrier facing surface 45*b* of the second connection portion 40 may be in contact with the carrier 10. For example, when the carrier facing surface 45*b* comes into contact with the front surface 10*b* of the carrier 10, the alignment of the second connection portion 40 with respect to the carrier 10 and the integrated semiconductor laser 20 can be easily performed.

For example, at least one of the first connection portion 30 and the second connection portion 40 may be made of a metal. For example, when the second connection portion 40 is made of a metal, the metal has a higher heat dissipation than the insulator, so that the heat dissipation from the laser unit 22 to the board 2 via the second connection portion 40 can be improved.

When at least one of the first connection portion 30 and the second connection portion 40 is made of a metal, the material of the first connection portion 30 and the second connection portion 40 is, for example, copper tungsten (CuW), copper molybdenum (CuMo), gold (Au), silver (Ag), copper (Cu), aluminum (Al), platinum (Pt), or an alloy containing at least one thereof.

However, the material of the first connection portion 30 and the second connection portion 40 may be other than a metal. For example, at least one of the first connection portion 30 and the second connection portion 40 may be made of an insulator. The material of the first connection portion 30 and the second connection portion 40 may be, for example, aluminum nitride (AlN) or may be a synthetic diamond crystal.

When the first connection portion 30 or the second connection portion 40 is made of an insulator, a metal pattern is formed on the surfaces (for example, the first surface 31 and the second surface 32) which are in contact with the modulator 21 of the first connection portion 30 or the carrier 10 and the surfaces (for example, the third surface 41, the fourth surface 42, and the carrier facing surface 45*b*) which are in contact with the laser unit 22 of the second connection portion 40, the carrier 10, or the board 2. As described above, when the first connection portion 30 or the second connection portion 40 is made of an insulator, the high-frequency characteristics can be improved, and the laser unit 22 can also obtain the effect of the high-frequency return path.

The material of the first connection portion 30 and the material of the second connection portion 40 may be the same as each other or may be different from each other. For example, the first connection portion 30 may be made of an insulator, and the second connection portion 40 may be made of a metal. In this case, the effect of the high-frequency return path of the first connection portion 30 can be obtained and the heat dissipation of the laser unit 22 which is a heating body with respect to the second connection portion 40 can be performed more effectively.

Next, the function and effect obtained from the light semiconductor device 1 according to the embodiment will be described. The light semiconductor device 1 includes the board 2, the carrier 10, and the integrated semiconductor laser 20, and the integrated semiconductor laser 20 includes the modulator 21 and the laser unit 22. The integrated semiconductor laser 20 is mounted on the carrier 10 so that each of the front surfaces 21*b* and 22*b* of the modulator 21 and the laser unit 22 faces the front surface 10*b* of the carrier 10. The carrier 10 has the first pattern 11, the second pattern 12, and the third pattern 13 on the front surface 10*b* of the carrier 10, and the modulator 21 has the second electrode 24 on the front surface 21*b* of the modulator 21. The laser unit 22 has the fourth electrode 26 on the front surface 22*b* of the laser unit 22. The fourth electrode 26 is connected to the third pattern 13 of the carrier 10, and the second electrode 24 is connected to the first pattern 11 of the carrier 10.

The light semiconductor device 1 includes the first connection portion 30 and the second connection portion 40. The first connection portion 30 connects the first electrode 23 formed on the back surface 21*c* of the modulator 21 and the second pattern 12 formed on the front surface 10*b* of the carrier 10. Therefore, when the cathode electrode is formed as the first electrode 23 on the back surface 21*c* of the modulator 21, the return path of the high-frequency signal fed from the line (first pattern 11) can be secured, and the inductance that reaches the GND side can be reduced.

Furthermore, the second connection portion 40 connects the third electrode 25 formed on the back surface 22*c* of the laser unit 22 and the front surface 2*b* of the board 2. Therefore, the laser unit 22 is connected to the front surface 2*b* of the board 2 via the second connection portion 40 and the heat dissipation path Y from the laser unit 22 to the board 2 can be secured, so that the heat dissipation can be improved.

The one end of the first connection portion 30 may have the first surface 31, the other end of the first connection portion 30 may have the second surface 32, the one end of the second connection portion 40 may have the third surface 41, and the other end of the second connection portion 40 may have the fourth surface 42. Therefore, the one end of the first connection portion 30 can be in surface-contact with the second pattern 12, and the other end of the first connection portion 30 can be in surface-contact with the first electrode 23 of the modulator 21. Then, the one end of the second connection portion 40 can be in surface-contact with the front surface 2*b* of the board 2, and the other end of the second connection portion 40 can be in surface-contact with the third electrode 25 of the laser unit 22. Therefore, the effect of the high-frequency return path X and the effect of securing the heat dissipation path Y can be further improved.

It should be noted that the modulator 21 and the laser unit 22 may be the integrated semiconductor laser 20 attached with a modulator, or the modulator 21 and the laser unit 22 may be separate bodies. Even if the modulator 21 and the laser unit 22 of the present disclosure are separate bodies, it is possible to obtain such an effect as securing the return path and securing the heat dissipation path by the first connection portion 30 and the second connection portion 40 of the light semiconductor device 1. It should be noted that in the semiconductor laser 20 attached with a modulator in which the modulator 21 and the laser unit 22 are integrated, the return path, the heat dissipation path, and the like are likely to be affected by the integration, and thus the effect of providing the first connection portion 30 and the second connection portion 40 of the light semiconductor device 1 can be further improved.

The second connection portion 40 further has the fifth surface 43 intersecting the third surface 41 of the second connection portion 40, and the third surface 41 of the second connection portion 40 is connected to the front surface 2*b* of the board 2, and the fifth surface 43 of the second connection portion 40 is arranged along the side surface 10*c* of the carrier 10. Therefore, the fifth surface 43, which is one side surface of the second connection portion 40, can be arranged along the carrier 10.

The board 2 may be made of a metal or an insulator. In this case, the board 2 made of a metal or the board 2 made of an insulator can be used.

The carrier 10 may be made of an insulator.

The first connection portion 30 may be made of a metal or an insulator. In this case, it is possible to use the first connection portion 30 made of a metal or the first connection portion 30 made of an insulator.

The second connection portion 40 may be made of a metal or an insulator. In this case, the second connection portion 40 made of a metal or the second connection portion 40 made of an insulator can be used.

At least one of the first connection portion 30 and the second connection portion 40 is made of an insulator, and a metal pattern may be formed on the front surface of the insulator. In this case, a metal pattern can be formed on the contact surface with the integrated semiconductor laser 20, the carrier 10, or the board 2 in at least one of the first connection portion 30 and the second connection portion 40. It should be noted that the thermal conductivity of the board 2 may be higher than the thermal conductivity of the carrier 10.

Figure 8:
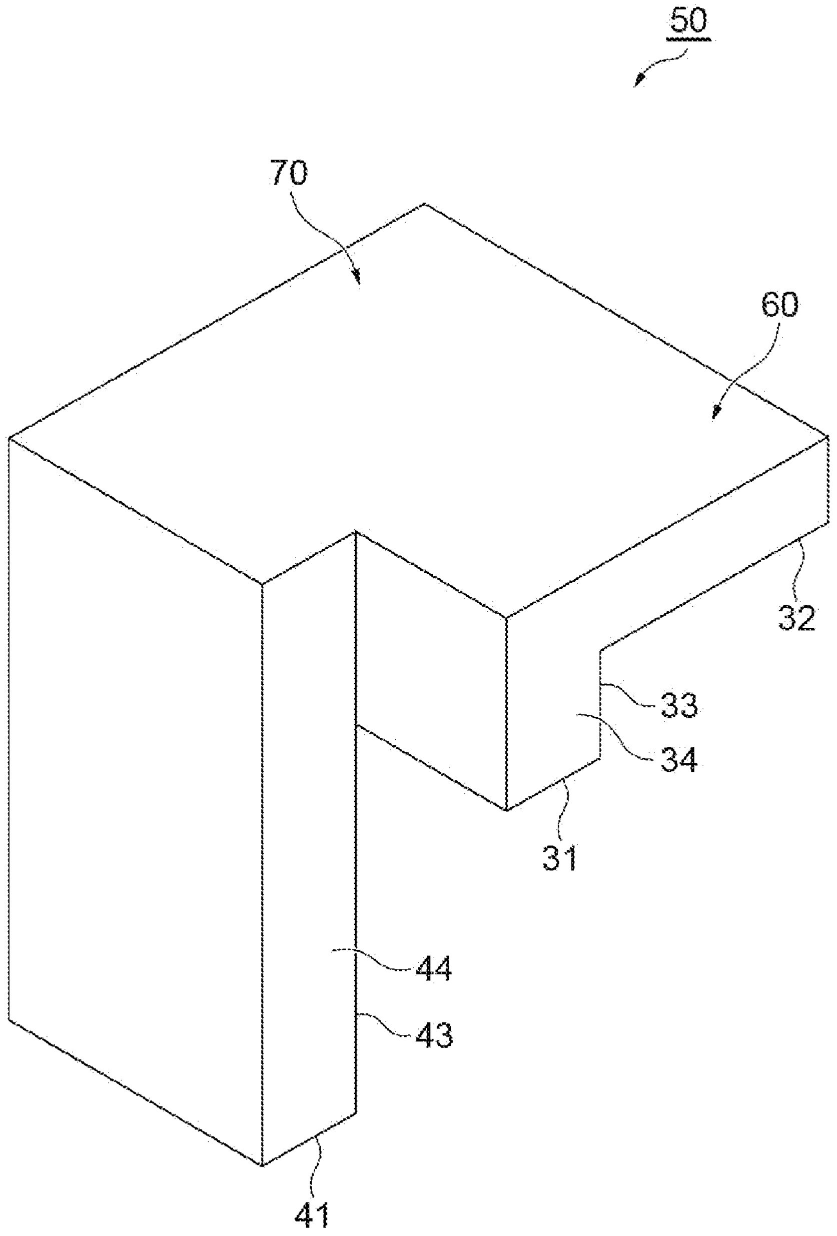
FIG. 8 is a perspective view illustrating a first connection portion and a second connection portion according to Modified Example.

Next, a connection portion 50 provided with a first connection portion and a second connection portion according to a modified example will be described with reference to FIG. 8. The connection portion 50 includes a first connection portion 60 having the same shape as the first connection portion 30 described above and a second connection portion 70 having the same shape as the second connection portion 40. Similarly to the first connection portion 30, the first connection portion 60 has the first surface 31, the second surface 32, the inner surface 33, and the outer surface 34. Similarly to the second connection portion 40, the second connection portion 70 has the third surface 41, the fourth surface 42, the fifth surface 43, the outer surface 44, and the convex portion 45.

As described above, in the light semiconductor device according to the modified example, the first connection portion 60 and the second connection portion 70 are integrated. That is, the first connection portion 60 and the second connection portion 70 are configured as one component. Therefore, it is possible to suppress an increase in the number of components and easily handle the first connection portion 60 and the second connection portion 70.

Heretofore, the embodiments and the modified examples of the light semiconductor device according to the present disclosure have been described. However, the present invention is not limited to the above-described embodiments. That is, it is easily recognized by those skilled in the art that the present invention can be modified and changed in various ways without changing the spirit described in the claims. For example, the shape, size, number, material, and arrangement mode of each component of the light semiconductor device are not limited to those described above but can be appropriately changed.

For example, in the above-described embodiments, the example including the board 2, the integrated semiconductor laser 20 including the laser unit 22, and the second connection portion 40 has been described. However, a light semiconductor device in which at least one of the board 2, the laser unit 22, and the second connection portion 40 is omitted may be used. That is, a light semiconductor device including only the carrier 10, the modulator 21, and the first connection portion 30 may be used. Also in this case, when the cathode electrode is formed on the back surface 21*c* of the modulator 21, the high-frequency return path X fed from the line can be secured. Therefore, the inductance that reaches the GND side can be reduced.

What is claimed is:

1. A light emitting semiconductor device comprising:

a board;

a carrier mounted on the board, the carrier having a front surface, and the front surface of the carrier having disposed thereon:

a first pattern for transmitting a signal, a second pattern having a reference potential constituting a coplanar circuit together with the first pattern, and a third pattern for supplying a direct current;

a modulator mounted on the carrier, the modulator having a back surface and a front surface, the modulator further having:

a first electrode provided on the back surface of the modulator and connected to the second pattern of the carrier, and a second electrode provided on the front surface of the modulator and connected to the first pattern of the carrier;

a laser unit mounted on the carrier, the laser unit having a front surface and a back surface, the laser unit further having:

a third electrode provided on the back surface of the laser unit and connected to the second pattern of the carrier, and a fourth electrode provided on the front surface of the laser unit and connected to the third pattern of the carrier;

a first connection portion having a first end connected to the second pattern of the carrier and a second end connected to the first electrode of the modulator; and a second connection portion having a first end connected to a front surface of the board and a second end connected to the third electrode of the laser unit, wherein the modulator and the laser unit are mounted so that the front surfaces of the modulator and the laser unit, respectively, and the front surface of the carrier face each other, wherein the first end of the first connection portion has a first surface, and the second end of the first connection portion has a second surface, and a sixth surface intersecting the firth first and second surfaces of the first connection portion, wherein the first end of the second connection portion has a third surface, and the second end of the second connection portion has a fourth surface, wherein the second connection portion has a convex portion between the fourth surface and a fifth surface, the fifth surface intersecting the third surface of the second connection portion, the convex portion of the second connection portion formed by a seventh and eighth surfaces, wherein the seventh surface interests the fourth surface of the second connection portion, and the eighth surface intersects the fifth and seventh surfaces, and wherein the first pattern is transmitting a signal to the modulator, the second pattern is a common ground for the laser and the modulator, and the third pattern is supplying a direct current to the laser unit.

2. The light semiconductor device according to claim 1, wherein the modulator and the laser unit are an integrated semiconductor laser attached with a modulator.

3. The light semiconductor device according to claim 1, wherein the third surface of the second connection portion is connected to the front surface of the board, and wherein the fifth surface of the second connection portion is arranged along a side surface of the carrier.

4. The light semiconductor device according to claim 1, wherein the board is made of a metal or an insulator.

5. The light semiconductor device according to claim 1, wherein the carrier is made of an insulator.

6. The light semiconductor device according to claim 1, wherein the first connection portion is made of a metal or an insulator.

7. The light semiconductor device according to claim 1, wherein the second connection portion is made of a metal or an insulator.

8. The light semiconductor device according to claim 6, wherein at least one of the first connection portion and the second connection portion is made of an insulator, and wherein a metal pattern is formed on a front surface of the first connection portion or the second connection portion.

9. The light semiconductor device according to claim 1, wherein the first connection portion and the second connection portion are integrated.

10. The light semiconductor device according to claim 1, wherein a thermal conductivity of the board is higher than a thermal conductivity of the carrier.

* * * * *